United States Patent

Tanaka et al.

[11] Patent Number: 5,416,470
[45] Date of Patent: May 16, 1995

[54] CONTACT JUDGING CIRCUIT AND CONTACT JUDGING METHOD FOR IMPEDANCE MEASURING APPARATUS

[75] Inventors: Hideshi Tanaka; Yasuaki Komatsu; Nobuhiro Shitara, all of Kobeshi; Naoko Ohtomo, Tachikawashi, all of Japan

[73] Assignee: Hewlett-Packard Company, Palo Alto, Calif.

[21] Appl. No.: 967,221

[22] Filed: Oct. 27, 1992

[30] Foreign Application Priority Data

Oct. 28, 1991 [JP] Japan .................................. 3-308485

[51] Int. Cl.$^6$ ............................................. G08B 21/00
[52] U.S. Cl. ................................... 340/660; 340/661; 340/664; 340/635; 324/133
[58] Field of Search ............... 340/635, 660, 661, 662, 340/663, 664; 324/133

[56] References Cited

U.S. PATENT DOCUMENTS 4,636,721  1/1987  Howell et al. .................. 324/133

OTHER PUBLICATIONS

Hewlett–Packard 4278A 1kHz/1MHz Capacitance Meter Operation Manual, Yokogawa–Hewlett-Packard, Ltd., Copyright 1987, Printed Apr. 1991, pp. 3–21.

Primary Examiner—Jeffery A. Hofsass

[57] ABSTRACT

The contact between a device under test (DUT) and a measuring terminal is accurately judged with a simple circuit for impedance measurement. The conduction detecting means injects a judging current into the voltage terminal ($L_P$) for low voltage. When the device under test (DUT) and both the current terminal ($L_C$) for low voltage and the voltage terminal ($L_P$) for low voltage are normally contacted with each other, since the inverting input terminal of the inverting amplifier is virtually grounded, and the $L_C$ and $L_P$ are substantially kept at the ground potential, the contact judgment for $L_C$ and $L_P$ is made by detecting the potentials of $L_P$. In addition, when the impedance measurement value is larger than the predetermined lowest limit value and the current measurement value is lower than the predetermined lowest limit value, the DUT and the current terminal ($H_C$) for high voltage are considered to have improper contact with each other. When the current measurement value is larger than the predetermined lowest limit value, and the impedance measurement value is lower than the predetermined lowest limit value, the DUT and the voltage terminal ($H_P$) for high voltage are considered to have improper contact with each other.

5 Claims, 3 Drawing Sheets

CONTACT JUDGING CIRCUIT AND CONTACT JUDGING METHOD FOR IMPEDANCE MEASURING APPARATUS

FIELD OF THE INVENTION

This invention relates to a contact judging circuit and a method of an impedance measuring, and particularly to a contact judging circuit which accurately determines when there is a normal contact between a device under test (DUT) and a measuring terminal in measuring the impedance of the DUT.

BACKGROUND OF THE INVENTION

A two-terminal or four-terminal measuring apparatus has been widely utilized to measure the impedance of circuit elements such as a resistor, an inductor, a capacitor, etc. FIG. 1 shows one example of the two-terminal-connection-type measuring apparatus. In this example, both terminals of a device under test (DUT) 1 are respectively connected to measuring terminals H and L. A measuring voltage is applied to the measuring terminals H and L by a voltage source 11 ($V_S$), and a current flowing through the measuring terminals H and L is measured by an ammeter 12 ($A_m$). The impedance of the DUT 1 is obtained from the vector ratio of values read by the voltage source 11 and the ammeter 12.

However, when an abnormal contact is made between the DUT 1 and the measuring terminals H and L during an impedance measurement in the above measuring apparatus, an error value is inevitably obtained as a measured impedance value. Although this abnormality may be caused by defect in the DUT 1 itself or by an imperfect contact, it is not easy to determine a cause for the erroneous impedance value. In order to overcome this disadvantage, a method has been proposed based upon an assumption that an impedance value which is measured under the imperfect contact is substantially larger than that under normal contact. According to this method, a predetermined highest value is set as a threshold value, and whether or not a normal contact has taken place is determined with respect to this threshold value. An abnormal contact includes an imperfect contact or non-contact. However, when the above method is applied to a capacitor as the DUT 1 for an insulation test, since the capacitor inherently has large resistance, a proper predetermined highest limit value cannot be easily determined.

In order to overcome the above disadvantage, another method has been proposed in which an electrical property of the DUT is considered as shown in FIG. 2. FIG. 2 is a circuit diagram for the insulation test of the DUT 1 which comprises a capacitor $C_X$ and a resistor $R_X$. A DC voltage and an alternating voltage are respectively applied to the measuring terminals H and L by a DC voltage source 21 ($V_{S1}$) and an alternating voltage source 22 ($V_{S2}$). The DC current is measured through a resistor R by a DC ammeter 23 ($A_{m1}$), while the alternating current is measured through a capacitor C by an alternating ammeter 24 ($A_{m2}$). In the original insulation test, a current is caused to flow through the resistor $R_X$ by the DC voltage source 21, and the current value flowing through the resistance $R_X$ is measured by the DC ammeter 23. If an abnormal contact is made between the DUT 1 and the measuring terminal H or L, the alternating current that flows through the capacitor $C_X$ is very small. Thus, the measured value of the alternating ammeter 24 is distinctly lower than a normal value. Therefore, the contact judgement can be made with high accuracy in the above method.

In the measuring apparatuses as shown in FIGS. 1 and 2, inductance of circuit elements other than the DUT 1 such as a cable in a measuring circuit, is not taken into account. The alternating voltage ($V_S$, $V_{S2}$) is merely regarded as the voltage across the DUT. Thus, the accuracy in the impedance measurement using the above measuring apparatuses is not acceptable. A four-terminal measuring apparatus substantially improves the impedance measurement by overcoming a measurement error due to extraneous inductance, e.g., from a connecting cable.

FIG. 3 shows an example of a prior art four-terminal impedance measuring apparatus with a contact judging circuit. In FIG. 3, one end of the DUT 1 is connected to measuring terminals $H_C$ (current terminal for high voltage) and $H_P$ (voltage terminal for high voltage). The other end of the DUT 1 is connected to measuring terminals $L_C$ (current terminal for low voltage) and $I_P$ (voltage terminal for low voltage). This four-terminal impedance measuring apparatus is designed to selectively switch the connections (41–44) among the DUT 1, plural voltage sources and meters for measuring the impedance and judging the contact. When the switches 41 through 44 are closed on the A side as shown in FIG. 3, a voltage signal from an alternating voltage source 31 ($V_{S1}$) is applied to the terminals $H_C$ and $L_C$, and the voltage across the DUT 1 is measured by an alternating voltmeter 32 ($V_{m1}$) connected across the measuring terminals $H_P$ and $L_P$. At the same time, the current flowing through the DUT 1 is measured by an ammeter 33 ($A_{m1}$) which is connected to the measuring terminal $L_C$. The impedance of the DUT 1 is obtained from the vector ratio between the measured voltage and current values.

Still referring to FIG. 3, when the switches 41 through 44 are closed on the B side (not shown), a voltage signal from a DC voltage source 34 ($V_{S2}$) is applied to the measuring terminals $H_C$ and $H_P$, and a voltage signal from a DC voltage source 36 ($V_{S3}$) is applied to the measuring terminals $L_C$ and $L_P$. If the contact at each terminal is normal, the voltmeters 35 and 37 respectively read the voltages from voltage sources 34 and 36. However, if any contact is improper, either of the voltmeters 35 and 37 reads a lower value than the expected voltage. Therefore, the contact is easily judged using this prior art apparatus.

In general, the following factors are considered in determining whether the contact judging operation is effective.

(1) The time required for the contact judgment is relatively short.
(2) The construction of the contact judgment apparatus is simple.
(3) The restriction due to the electrical characteristics of a DUT is relatively minor.
(4) The energy delivery to and from a DUT is low.

The first two conditions are satisfied by the four-terminal measuring apparatus as shown in FIG. 3. However, when the DUT comprises a capacitor or inductor, energy is frequently accumulated in the circuit elements, and current flows into the DUT. Therefore, if the conditions (3) and (4) are critical, a switch for timing the application of voltage signals and or a circuit for preventing a DC current flow into the DUT must be added to the prior art apparatus. These countermeasures sacrifice the condition (2) and also cause a new transient phenomenon.

The current invention has solved the above problems by providing a contact judging circuit and method for DUT impedance measuring in which a contact between a DUT and each measuring terminal is accurately judged with a simple circuit.

SUMMARY OF THE INVENTION

The contact judging circuit according to this invention is used in a four-terminal connection type of impedance measuring apparatus. The contact judging circuit is connected to the voltage terminal for low voltage. The current terminal for low voltage is connected to an inverting input terminal of an inverting amplifier which has a current measuring resistor between the inverting input terminal and an output terminal. Its non-inverting input terminal is grounded. Therefore, the inverting input terminal of the inverting amplifier is virtually grounded.

At this time, when a normal contact is made between the DUT and each of the low voltage terminals, the current terminal for low voltage and the voltage terminal for low voltage are in a complete conductive state. As a result, the ground potential occurs at the voltage terminal for low voltage, and the terminal potential measuring means measures this ground potential.

When abnormal contact is made between the DUT and either of the low voltage terminals, the voltage terminal for low voltage is not at ground potential. Therefore, by measuring the potential of the voltage terminal for low voltage by the terminal potential measuring means, it can be judged whether the contact between the DUT and the low voltage terminals is normal. That is, when the contact judging circuit is connected to the voltage terminal for low voltage and the voltage terminal for low voltage has a substantial ground potential, it is considered that the DUT and the each of the voltage terminals have a proper contact. On the other hand, when the voltage terminal for low voltage does not have a ground potential, it is considered that the DUT and the low voltage terminals have an improper contact.

Further, when the impedance measurement value is larger than the predetermined lowest limit value, and the current measurement value is lower than the predetermined lowest limit value, it is judged that the DUT and the current terminal for high voltage have an improper contact. In addition, when the current measurement value is larger than the predetermined lowest limit value, and the impedance measurement value is lower than the predetermined lowest limit value, it is considered that the DUT and the voltage terminal for high voltage have an improper contact.

Still further, when the four-terminal connection-type impedance measuring apparatus is used as the two-terminal connection type, and the impedance measurement value is higher than the predetermined highest limit value, it is considered that the DUT is not contacted with the current terminal for high voltage or the current terminal for low voltage.

DETAILED DESCRIPTION OF THE PREFERRED EMBODIMENT

Figure 4:
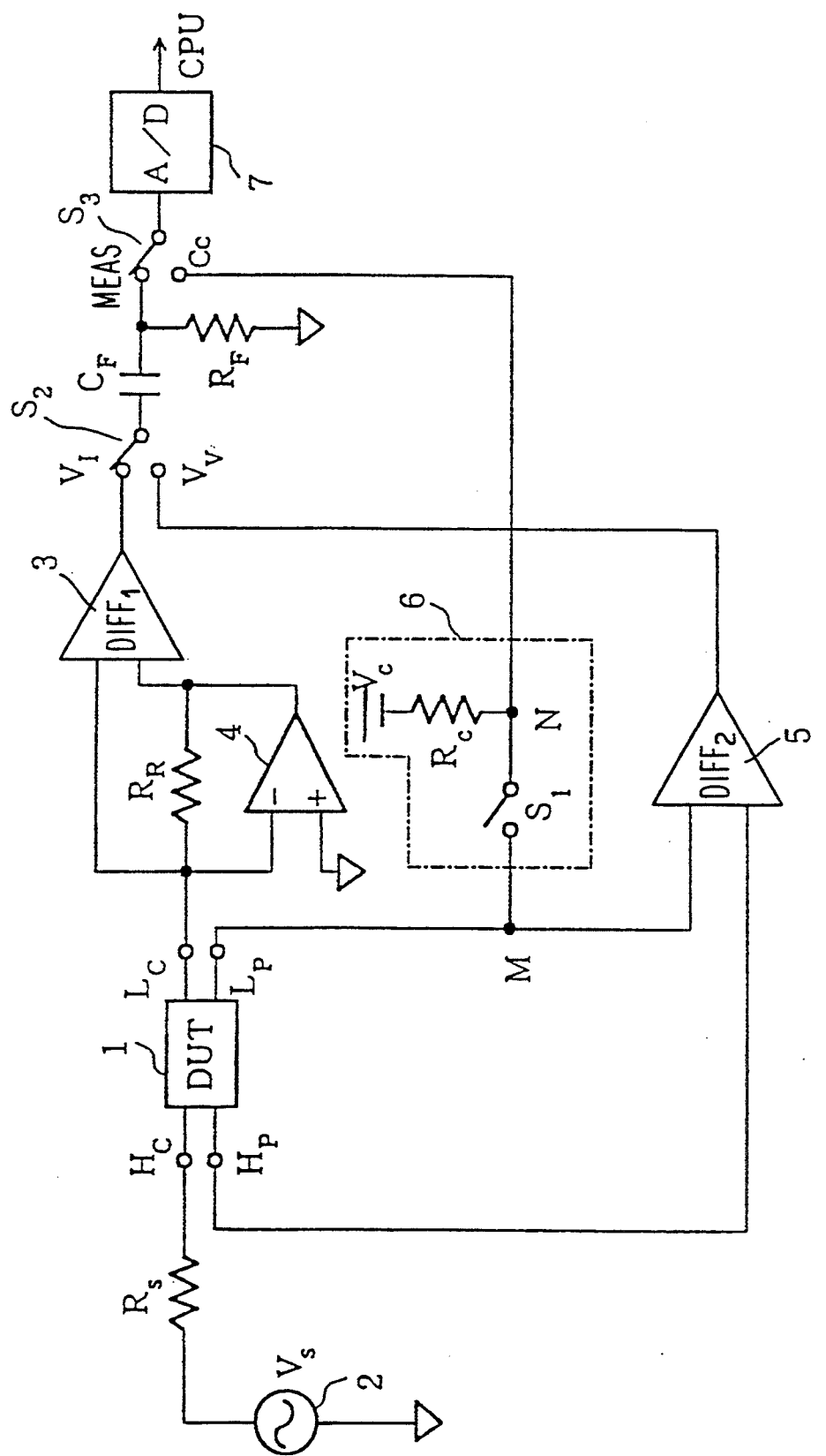
FIG. 4 is a circuit diagram showing a preferred embodiment of this invention for impedance measuring.

FIG. 4 is a preferred embodiment of the present invention for measuring impedance while determining a proper contact. In FIG. 4, one end of the DUT 1 is connected to both a current terminal for high voltage $H_C$ and a voltage terminal for high voltage $H_P$. The other end of the DUT 1 is connected to both a current terminal for low voltage $L_C$ and a voltage terminal for low voltage $L_P$. The terminal $H_C$ is connected through a source resister $R_S$ to an alternating voltage source 2 ($V_S$) with one grounded end for supplying an impedance measuring signal to the DUT 1.

The terminal $L_C$ is connected to a current measuring resistor $R_R$. Respective ends of the resistor $R_R$ are connected to corresponding input terminals of a differential amplifier 3 (diff$_1$), and are also connected to an inverting amplifier 4 for which the resistor $R_R$ serves as a feedback resistor. Thus, the inverting amplifier 4 has an input from one terminal of the resistor $R_R$ at the $L_C$ side and an output connected to the other terminal of the resistor $R_R$. In addition, the input terminals of the differential amplifier 5 (diff$_2$) are connected to the terminals $H_P$ and $L_P$ respectively.

The output of the differential amplifiers 5 and 3 are respectively connected to input terminals $V_I$ and $V_V$ of a switch $S_2$ for selecting either the voltage signal or the current signal for an impedance measurement. The output terminal of switch $S_2$ is connected through a C-R filter which comprises $C_F$ and $R_F$, for substantially eliminating a direct current to an input terminal (means) of a switch $S_3$ for selecting either impedance measurement or contact judgment.

Still referring to FIG. 4, the terminal $L_P$ is connected to one end of conduction detecting means 6 of this invention which serves to inject a judging signal to the terminal Lp. In FIG. 4, the conduction detecting means 6 comprises a judging current injection switch $S_1$, a judging current injection resistor $R_C$, and a judging voltage source $V_C$. One end of the switch $S_1$ is connected to the terminal $L_P$ at connection point M, while the other end is connected to one end of the resistor $R_C$ at connection point N. The other end of the resistor $R_C$ is connected to a judging voltage source $V_C$. Connection point N is also connected to an input terminal $C_C$ of the switch $S_3$. However, the input terminal $C_C$ may alternately be connected to the terminal M.

The output terminal of the switch $S_3$ is connected to a CPU through an A/D converter 7. The digital output signal of the A/D converter 7 is suitable for software processing by CPU as shown in FIG. 4.

In the preferred embodiment of the invention as described above, the terminal potential measuring means comprising the conduction detecting means 6 and the A/D converter 7 constitutes a main part of the judging circuit of this invention. Although in this preferred embodiment, the A/D converter 7 is used in the terminal potential measuring means, the measuring means is not limited to the A/D converter. Any means for monitoring the voltage may replace the A/D converter.

The contact judging method of the current invention will now be described. The judging current injection switch S is first switched on for judging the contact between terminals $L_C$ and $L_P$. If the DUT 1 has a normal contact at both terminals $L_C$ and $L_P$ and the terminals $L_C$ and $L_P$ are connected, the resistors $R_C$ and $R_R$ and the inverting amplifier 4 constitute the inverting amplifying circuit. The inverting input terminal of the inverting amplifier 4 is virtually kept at ground potential. Thus, the terminal $L_C$ is kept at ground potential by this ground-level feedback means. Since the terminals $L_C$ and $L_P$ are conductively connected to each other, the terminal $L_P$ is also kept at ground potential. At this time, if the terminal $C_C$ is selected at switch $S_3$ and the terminal Lp is at ground potential, there is no significant output from A/D 7, and the DUT 1 is determined to have a proper contact with both terminals $L_C$ and $L_P$. On the other hand, when the DUT 1 has an improper contact with either terminal $L_C$ or $L_P$, the potential of terminal $L_P$ is not at ground. Therefore, by closing the switch $S_3$ at $C_C$, the potential of the terminal $L_P$ is monitored through the A/D converter 7 to detect an improper contact of the terminals $L_C$ or $L_P$.

The contact judgment between the DUT 1 and the terminals $H_C$ and $H_P$ is made in the following manner. First, the lowest limit values for the current measurement value and the impedance measurement value are respectively predetermined. These limit values may be suitably set in accordance with various conditions, and in this embodiment, these values are chosen to be one tenth of the lowest value in the ordinary measurement range.

Next, the current measurement value and the impedance measurement value are obtained. If the impedance measurement value is larger than the predetermined lowest limit impedance value, but the current measurement value is lower than the predetermined lowest limit current value, the DUT 1 and the terminal He are considered to have an improper contact with each other. Under certain circumstances, even though the DUT 1 and the terminal $H_C$ do not have a proper contact, the impedance measurement value is erroneously considered normal because a certain voltage is applied to the DUT 1 and a current corresponding to the voltage flows through the DUT 1. However, the contact can be accurately judged by setting the lowest limit value for the current measurement value for the above case. Further, when the current measurement value is larger than the predetermined lowest limit value and the impedance measurement value is lower than the predetermined lowest limit value, the DUT 1 and the terminal $H_P$ are considered to have an improper contact with each other.

Figure 1:
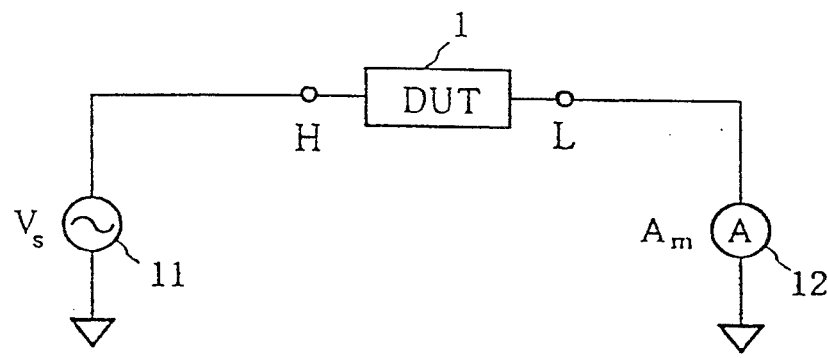
FIG. 1 is a circuit diagram showing a prior art two-terminal connection-type impedance measuring apparatus.
Figure 2:
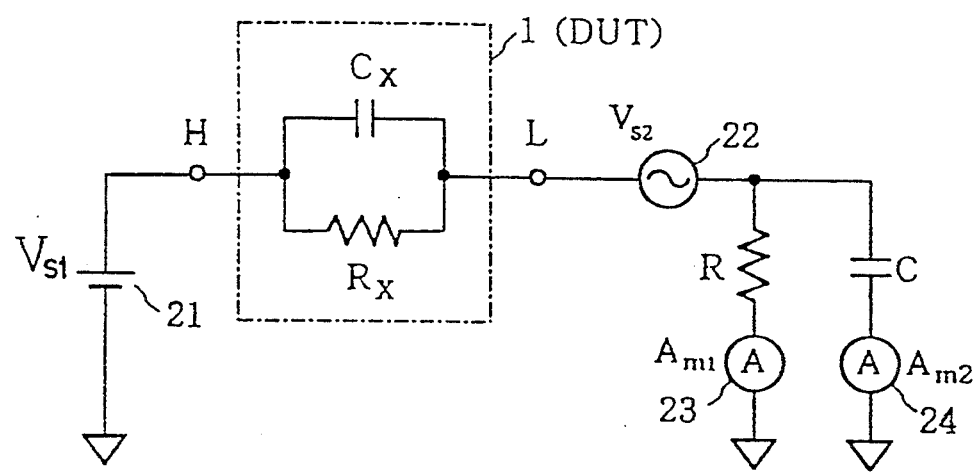
FIG. 2 is a circuit diagram showing a two-terminal connection type of impedance measuring apparatus with a prior art contact judging circuit.
Figure 3:
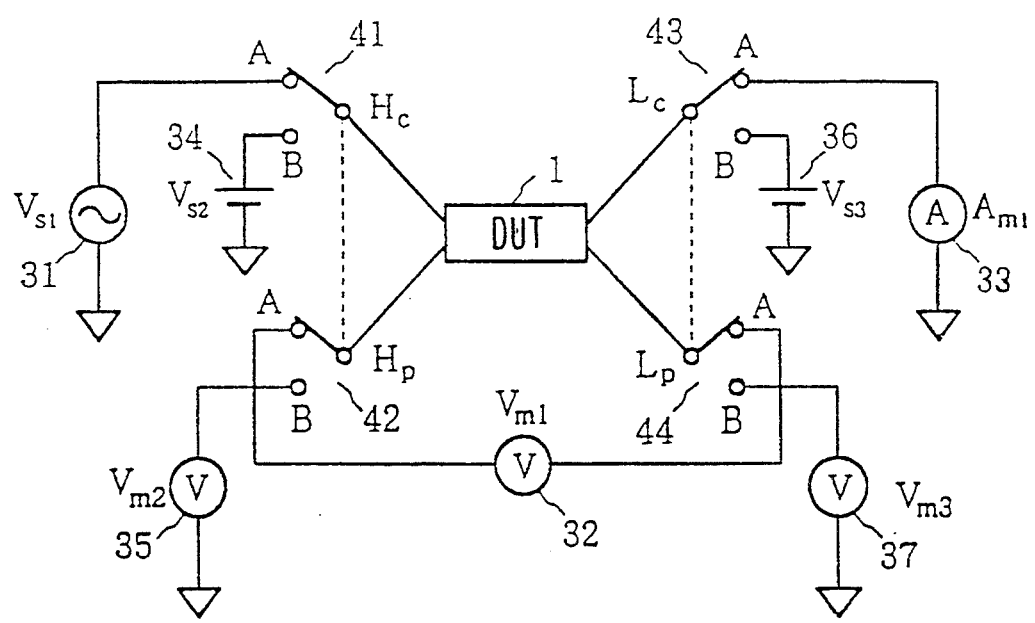
FIG. 3 is a circuit diagram showing a four-terminal connection type of impedance measuring apparatus with a prior art contact judging circuit.

The four-terminal connection type of impedance measuring apparatus as shown in FIG. 4 may be used as a two-terminal connection type by selecting an appropriate predetermined highest limit value for the impedance measurement value. For example, a predetermined highest limit value is slightly greater than an impedance of the DUT such as $V_{s2}/A_{m1}$ is satisfied in FIG. 3. If the impedance measurement value is larger than the predetermined highest limit impedance value, the DUT 1 and the terminal $H_C$ or $L_C$ are considered to have an improper contact with each other. In this manner, a user can perform an impedance measurement without paying attention to the difference between the two-terminal and four-terminal connections.

In the above embodiments, the judging voltage $V_C$ may be either positive or negative. When the judging voltage is positive, the conduction detecting means 6 supplies the terminal $L_P$ with a positive current, while when the judging voltage is negative, the conduction detecting means 6 supplies the terminal $L_P$ with a negative current.

The alternating voltage source 2 is used as the signal source as shown in FIG. 4. Thus, even if a potential difference occurs across the current measuring resistor $R_R$ due to a direct current, the DC component of a voltage across the resistor $R_R$ is substantially eliminated by the C-R filter. Therefore, the contact judgment and the impedance measurement are both performed reliably.

The following effects are obtained by this invention as described above. The elements which perform the contact judgment between the DUT and the terminals $L_C$ or $L_P$ include the conduction detecting means 6 and switch $S_3$. The conduction detecting means can be constructed, for example, by only a switch and a resistor. Therefore, the construction of the contact judging circuit is substantially simplified. Since the current for contact judgment is input to the virtual ground point of the inverting operational amplifier, the energy delivery to and from the DUT is controlled. The contact judgment is not restricted by the DUT characteristics. For example, when an inductor having no resistance to DC is measured using an alternating signal as in FIG. 4 along with the source resistor $R_S$ of 100 ohms and the inverting amplifier having 1 mV off-set voltage, the DC component flowing through the inductor is 10 $\mu$A at maximum. In addition, since only an original AC component is applied to the high voltage terminal side of $H_C$ and $H_P$, even if the DUT is a cell a direct measurement can be taken and a direct judgment can be made without modification to the system.

In general, the processing speed of software is slower than that of hardware. The processing time required for the contact judgment of the high voltage terminals $H_C$ and $H_P$ according to the preferred embodiment is about 1 msec. Although it depends upon the arithmetic processing performance of a microprocessor and so on, this time corresponds to about 5% of the total measuring time in a high-speed measurement. The software processing time for the contact judgement is substantially small in comparison with the total required time. Therefore, for the contact judgment of the high voltage terminals $H_C$ and $H_P$, the software processing is comparable to that processed by the hardware alone in this embodiment. Further, if an application demands the contact judgment and impedance measurement value at the same time, the measurement value is simultaneously compared with a predetermined highest limit value or lowest limit value. Thus, both the contact judgement and impedance measurement are performed without reconfiguring any connection.

Since the highest limit value or the lowest limit value for the impedance measurement value can be automatically predetermined within the range of the measuring impedance, a user is free from performing the setting operation. In addition, since the user does not have to be aware of the difference between the two-terminal and the four-terminal connections, the user can take advantage of the current invention without any additional learning.

What is claimed is:

1. A contact judging circuit having current and voltage terminals for high voltage which are connected to the front end of a device under test (DUT), and current and voltage terminals for low voltage which are connected to the other end of the DUT, comprising:

ground-level feed-back means for maintaining the potential of said current terminal for low voltage substantially at ground level; and a conduction detecting means connected to said voltage terminal for low voltage for injecting a judging current;

terminal potential measuring means for measuring a potential of said voltage terminal for low voltage when said conduction detecting means injects said judging current;

voltage measuring means connected to said voltage terminal for high voltage and said voltage terminal for low voltage for measuring a voltage value across said two voltage terminals; and a signal source for supplying an impedance measuring signal to said DUT through said current terminal for high voltage.

2. A contact judging circuit according to claim 1 wherein said ground-level feed-back means further comprises:

current measuring means for converting a current flowing between said current terminal for high voltage and said current terminal for low voltage to a voltage through a current measuring resistor; and an inverting amplifier having an inverting input terminal connected to one terminal of said current measuring resistor at the side of current terminal for low voltage, an output terminal being connected to the other terminal of said current measuring resistor, and a non-inverting input terminal being connected to ground.

3. A contact judging method for ascertaining terminal connection of an impedance measuring apparatus to a device under test (DUT), said impedance measuring apparatus having a current terminal and voltage terminal for high voltage which are connected to one end of said DUT, and current terminal and voltage terminal for low voltage which are connected to the other end of said DUT, said current terminal for high voltage being connected to a signal source, said current terminal for low voltage being maintained substantially at ground level, and said voltage terminals for high voltage and low voltage being connected to a voltage measuring means, comprising the steps of:

a) setting a predetermined lowest limit impedance value for a measured value of the DUT impedance;

b) setting a predetermined lowest limit current value for a measured value of current through said DUT;

c) measuring said impedance measured value and said current measured value;

d) determining if an improper contact between said DUT and said current terminal for high voltage exists when the impedance measured value is larger than said predetermined lowest limit impedance value and said current measured value is lower than said predetermined lowest limit current value; and e) determining if an improper contact between the DUT and the voltage terminal for high voltage exists when said current measured value is larger than the predetermined lowest limit current value and said impedance measured value is lower than the predetermined lowest limit impedance value.

4. A contact judging method for ascertaining terminal connection of an impedance measuring apparatus having a current terminal and a voltage terminal for high voltage which are connected to one end of the device under test (DUT), and current terminal and a voltage terminal for low voltage which are connected to the other end of said DUT, said current terminal for high voltage being connected to a signal source, said current terminal for low voltage being maintained substantially at ground level, and said voltage terminals for high voltage and low voltage being connected to a voltage measuring means, comprising the steps of:

a) injecting a judging signal into the voltage terminal for low voltage; and b) determining a proper contact between the DUT and each of said voltage terminal for low voltage and said current terminal for low voltage when the voltage terminal for low voltage is substantially at a ground potential.

5. A contact judging method for ascertaining terminal connection of an impedance measuring apparatus having a current terminal and a voltage terminal for high voltage which are connected to one end of the device under test (DUT), and a current terminal and a voltage terminal for low voltage which are connected to the other end of said DUT, comprising the steps of:

a) setting a high limit impedance value for a impedance measured value;

b) taking a measurement of said measured impedance value; and c) determining if an improper contact for current terminals exists when said measured impedance value is larger than the predetermined highest limit impedance value.

* * * * *